(12) United States Patent
Chang et al.

(10) Patent No.: US 11,916,140 B2
(45) Date of Patent: Feb. 27, 2024

(54) COMPOUND SEMICONDUCTOR DEVICE

(71) Applicant: ELECTRONICS AND TELECOMMUNICATIONS RESEARCH INSTITUTE, Daejeon (KR)

(72) Inventors: Sungjae Chang, Daejeon (KR); Hokyun Ahn, Daejeon (KR); Hyunwook Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 196 days.

(21) Appl. No.: 17/508,933

(22) Filed: Oct. 22, 2021

(65) Prior Publication Data
US 2022/0246751 A1    Aug. 4, 2022

(30) Foreign Application Priority Data

Feb. 3, 2021 (KR) .................. 10-2021-0015161
Jun. 8, 2021 (KR) .................. 10-2021-0074293

(51) Int. Cl.
*H01L 29/778* (2006.01)
*H01L 29/78* (2006.01)

(52) U.S. Cl.
CPC ...... *H01L 29/7786* (2013.01); *H01L 29/7827* (2013.01); *H01L 29/785* (2013.01)

(58) Field of Classification Search
CPC ............ H01L 29/7786; H01L 29/7827; H01L 29/785; H01L 29/1054; H01L 29/66462; H01L 29/7832; H01L 29/1029; H01L 29/2003; H01L 29/7789; H01L 29/66431; H01L 29/778–7789; H01L 2924/13064; H01L 29/122–127; H01L 29/15–158
See application file for complete search history.

(56) References Cited

U.S. PATENT DOCUMENTS 9,136,347 B2  9/2015 Park et al.
9,461,160 B2  10/2016 Then
(Continued)

FOREIGN PATENT DOCUMENTS

JP  2008235465 A  10/2008
JP  2013243383 A  12/2013
(Continued)

OTHER PUBLICATIONS

S.-J. Chang et al., "Unusual gate coupling effect in extremely thin and short FDSOI MOSFETs", Microelectronic Engineering, 147 pp. 159-164, Apr. 17, 2015.

*Primary Examiner* — Cuong B Nguyen
(74) *Attorney, Agent, or Firm* — Rabin & Berdo, P.C.

(57) ABSTRACT

Provided is a compound semiconductor device. The compound semiconductor device according to embodiments of the inventive concept includes a first semiconductor layer having a fin extending in a first direction on a substrate, an upper gate electrode extending in a second direction perpendicular to the first direction on the first semiconductor layer, a second semiconductor layer disposed between a sidewall of the fin and the upper gate electrode, a dielectric layer disposed between a top surface of the fin and the upper gate electrode, and a lower gate structure connected to a bottom surface of the first semiconductor layer by passing through the substrate.

18 Claims, 21 Drawing Sheets

(56) References Cited

U.S. PATENT DOCUMENTS

| | | | |
|---|---|---|---|
| 9,755,027 B2 | 9/2017 | Lee et al. | |
| 10,134,854 B2 | 11/2018 | Ahn et al. | |
| 2015/0349124 A1* | 12/2015 | Lu | H01L 21/283 |
| | | | 438/105 |
| 2015/0357458 A1* | 12/2015 | Charles | H01L 29/42356 |
| | | | 257/76 |
| 2020/0251582 A1* | 8/2020 | Li | H01L 21/823431 |

FOREIGN PATENT DOCUMENTS

| | | |
|---|---|---|
| KR | 101031798 B1 | 4/2011 |
| KR | 20140085540 A | 7/2014 |
| KR | 20150077735 A | 7/2015 |
| KR | 102208076 B1 | 1/2021 |

\* cited by examiner

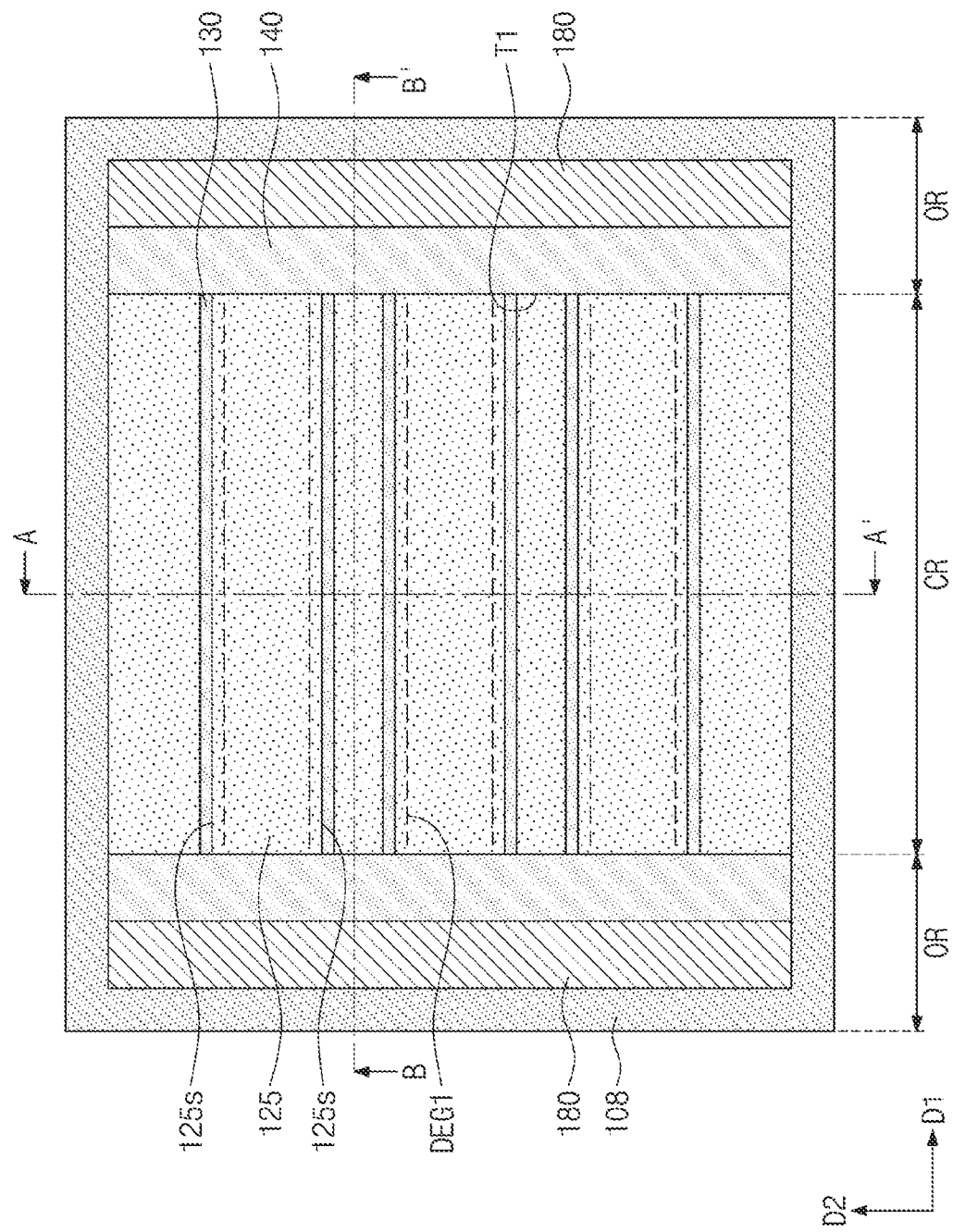

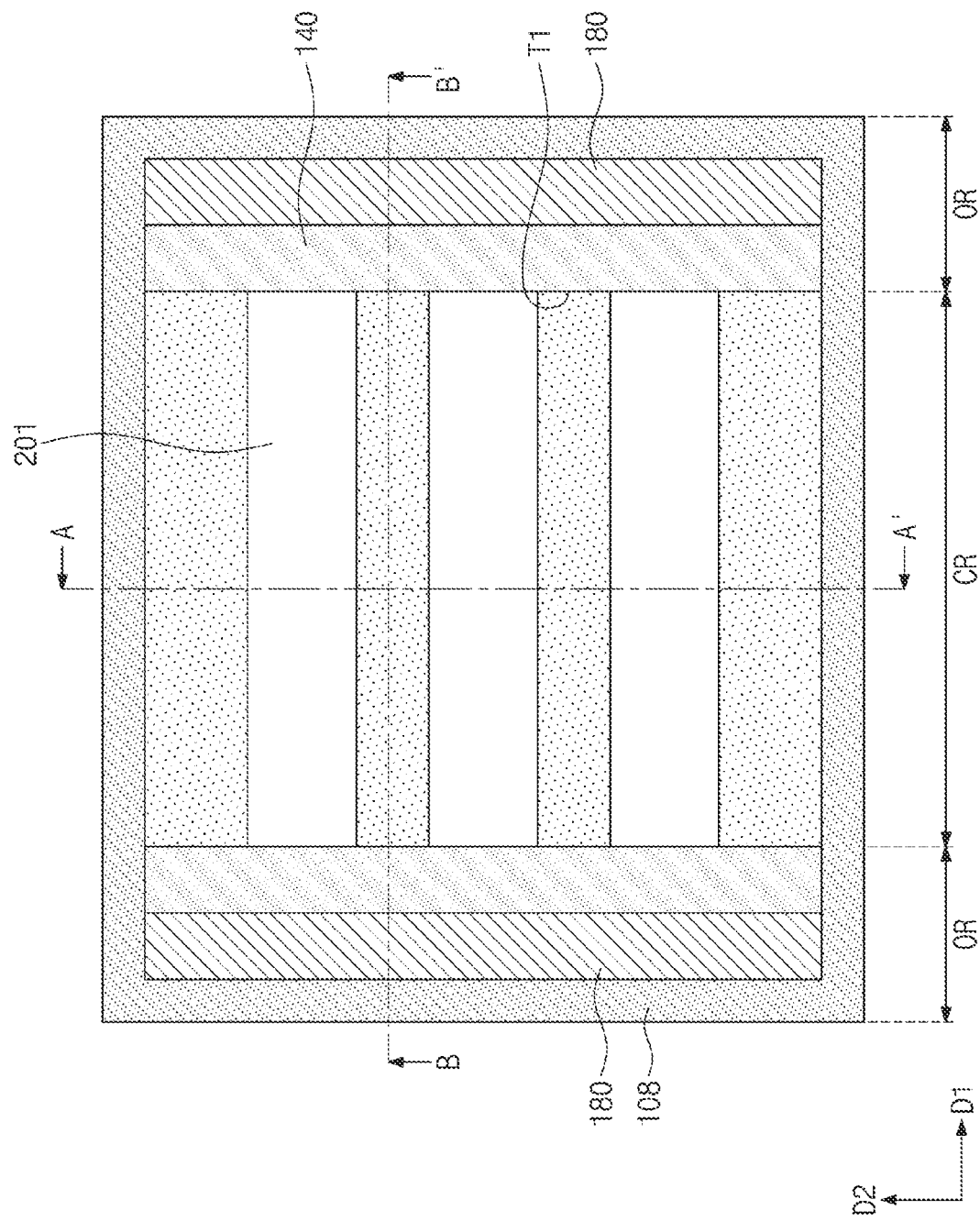

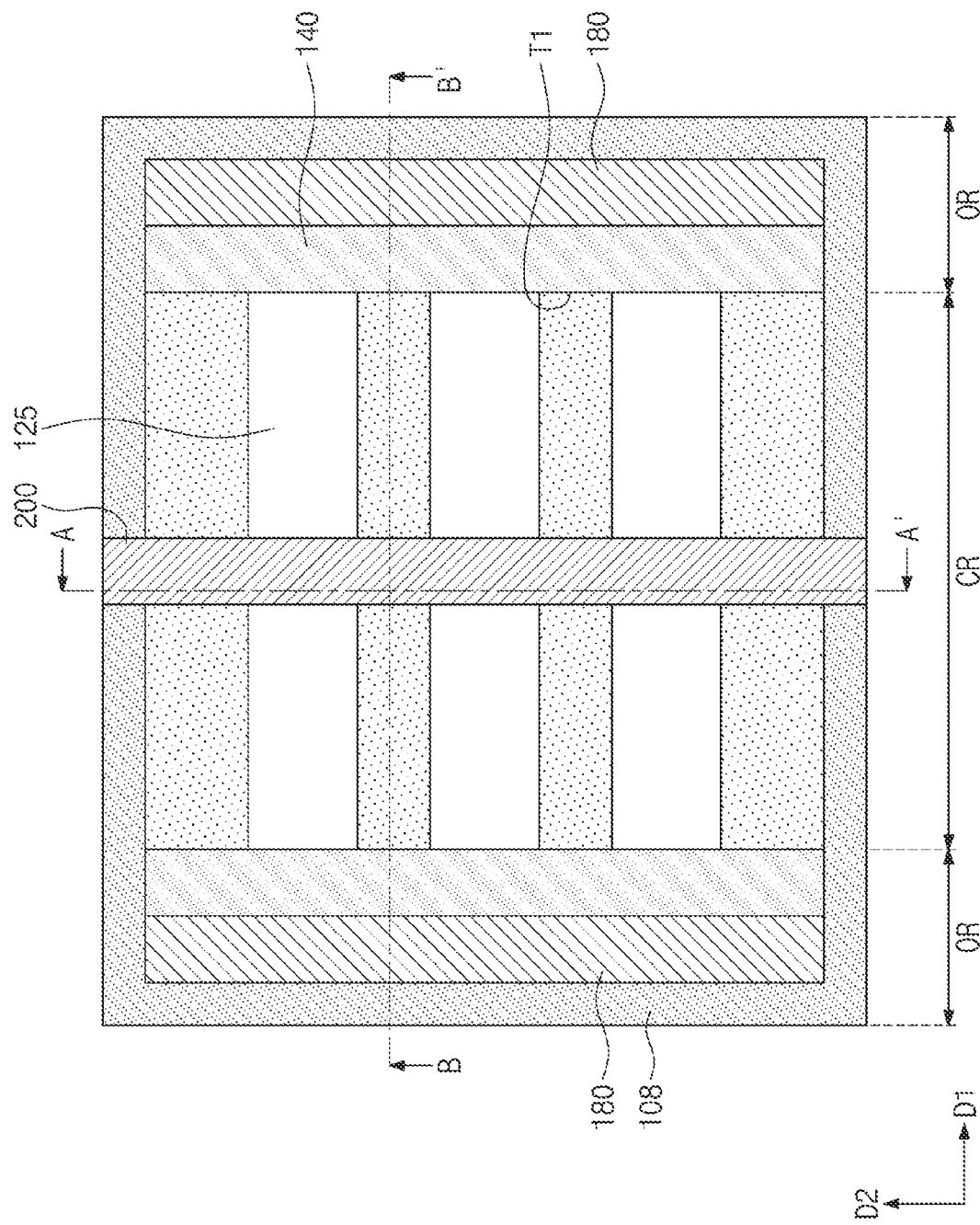

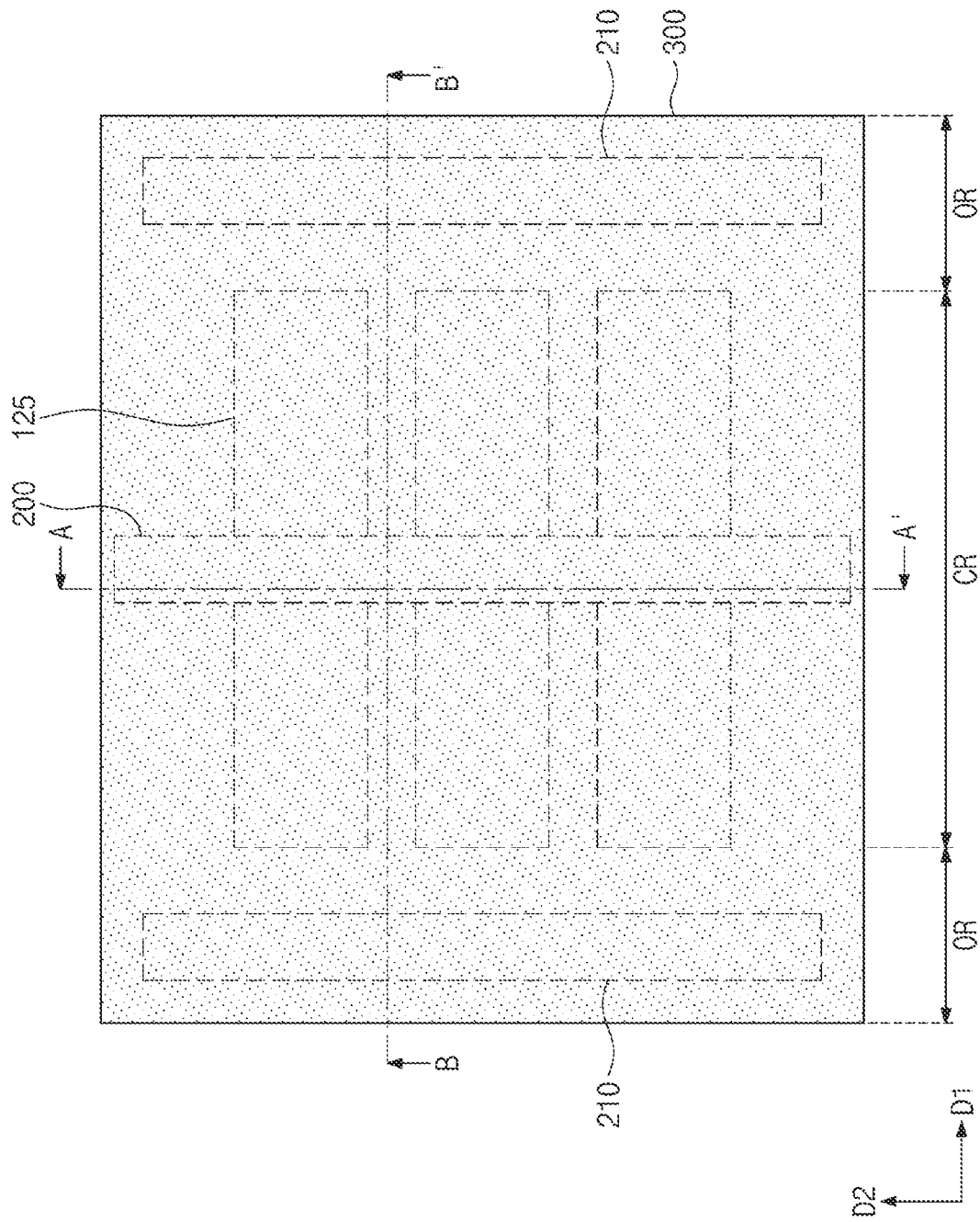

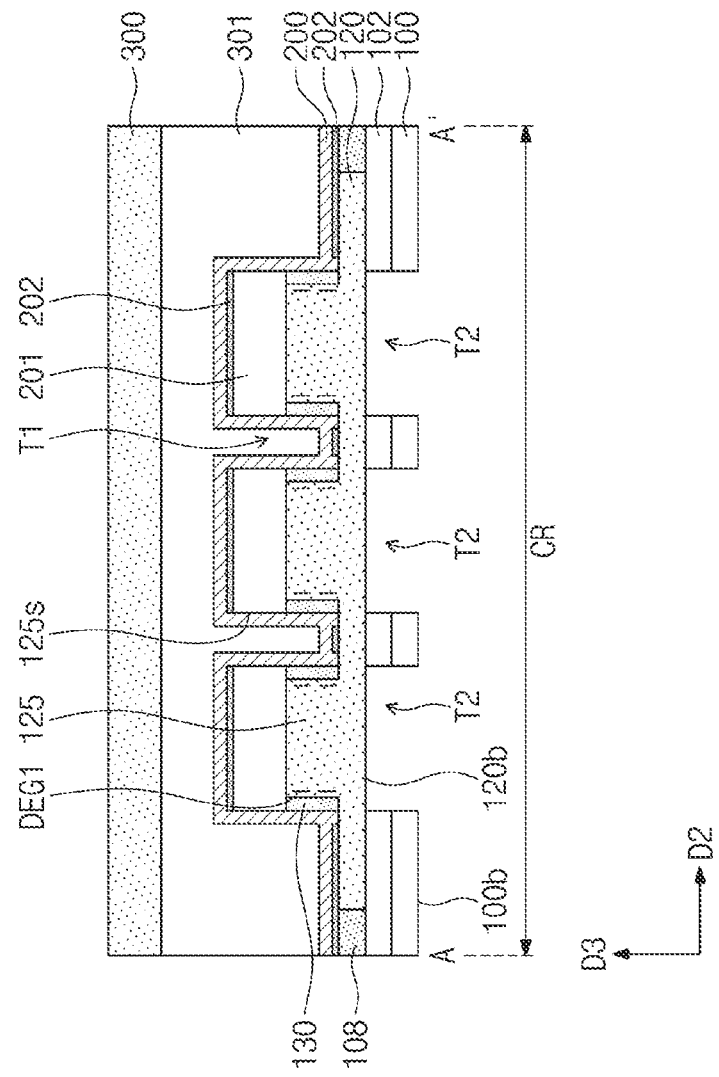

COMPOUND SEMICONDUCTOR DEVICE

CROSS-REFERENCE TO RELATED APPLICATIONS

This U.S. non-provisional patent application claims priority under 35 U.S.C. § 119 of Korean Patent Application Nos. 10-2021-0015161, filed on Feb. 3, 2021, and 10-2021-0074293, filed on Jun. 8, 2021, the entire contents of which are hereby incorporated by reference.

BACKGROUND

The present disclosure herein relates to a compound semiconductor device, and more particularly, to a compound semiconductor device including heterojunction semiconductor layers.

A compound semiconductor device may include various power devices. For example, when semiconductor layers having different energy bandgaps becomes attached, a high electron mobility transistor (HEMT) device include a 2-dimensional electron gas (2 DEG) layer generated by polarization and band-discontinuity close to the hetero-interface. The 2 DEG layer functions as a channel region (a passage through which electrons move from a source electrode to a drain electrode) of a transistor. The HEMT device is used in various fields because electrons existing in the 2 DEG layer have a high concentration and a fast mobility.

SUMMARY

The present disclosure provides a compound semiconductor device having a variable performance.

Embodiments of the inventive concept provide a compound semiconductor device including: a first semiconductor layer having a fin extending in a first direction on a substrate; an upper gate electrode extending in a second direction perpendicular to the first direction on the first semiconductor layer; a second semiconductor layer disposed between a sidewall of the fin and the upper gate electrode; a dielectric layer disposed between a top surface of the fin and the upper gate electrode; and a lower gate structure connected to a bottom surface of the first semiconductor layer by passing through the substrate.

In embodiments, the second semiconductor layer may extend along the sidewall of the fin in the first direction.

In embodiments, a width in the second direction of the second semiconductor layer may be less than a height of the second semiconductor layer.

In embodiments, the second semiconductor layer may have a top surface disposed at the same vertical level as a top surface of the fin.

In embodiments, the second semiconductor layer may have a bandgap different from that of the first semiconductor layer.

In embodiments, the dielectric layer may cover the top surface of the second semiconductor layer.

In embodiments, the compound semiconductor device may further include source and drain contacts spaced apart from each other in the first direction and connected to the first semiconductor layer, and the upper gate electrode may be disposed between the source and drain contacts.

In embodiments, the lower gate structure may extend in the second direction.

In embodiments, the lower gate structure may vertically overlap the upper gate electrode.

In embodiments, the compound semiconductor device may further include an interface insulation layer disposed between a top surface of the dielectric layer and the gate electrode, and the interface insulation layer may have a thickness less than that of the dielectric layer.

In embodiments, the upper gate electrode may have a lower end disposed closer to the bottom surface of the first semiconductor layer than the top surface of the fin.

In embodiments, the dielectric layer may have a thickness in a range from about 20 nm to about 100 nm.

In embodiments, the upper gate electrode may directly contact the second semiconductor layer.

In embodiments of the inventive concept, a compound semiconductor device includes: a first semiconductor layer having a fin extending in a first direction on a substrate; an upper gate electrode extending in a second direction perpendicular to the first direction on the first semiconductor layer; second semiconductor layers disposed between sidewalls of the fin and the upper gate electrode; and a dielectric layer disposed between a top surface of the fin and top surfaces of the second semiconductor layers, and the second semiconductor layers are spaced apart from each other in the second direction and extend in parallel to each other in the first direction.

In embodiments, the second semiconductor layers may have top surfaces disposed at the same vertical level as a top surface of the first semiconductor layer.

In embodiments, each of the second semiconductor layers may have a bandgap different from that of the first semiconductor layer.

In embodiments, the compound semiconductor device may further include a lower gate structure connected to a bottom surface of the first semiconductor layer by passing through the substrate, and the lower gate structure may extend in the second direction.

In embodiments, the compound semiconductor device may further include an interface insulation layer disposed between a top surface of the dielectric layer and the gate electrode, and the interface insulation layer may have a thickness less than that of the dielectric layer.

In embodiments, the upper gate electrode may directly contact the second semiconductor layers.

In embodiments, the compound semiconductor device may further include source and drain contacts spaced apart from each other in the first direction and connected to the first semiconductor layer, and the upper gate electrode may be disposed between the source and drain contacts.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIGS. 5A, 6A, 7A, 8A, 9A, and 10A are plan views for explaining a method for manufacturing a compound semiconductor device according to embodiments of the inventive concept;

FIGS. 5B, 6B, 7B, 8B, 9B, and 10B are cross-sectional views respectively taken along lines A-A' of FIGS. 5A, 6A, 7A, 8A, 9A, and 10A.

DETAILED DESCRIPTION

Figure 1:
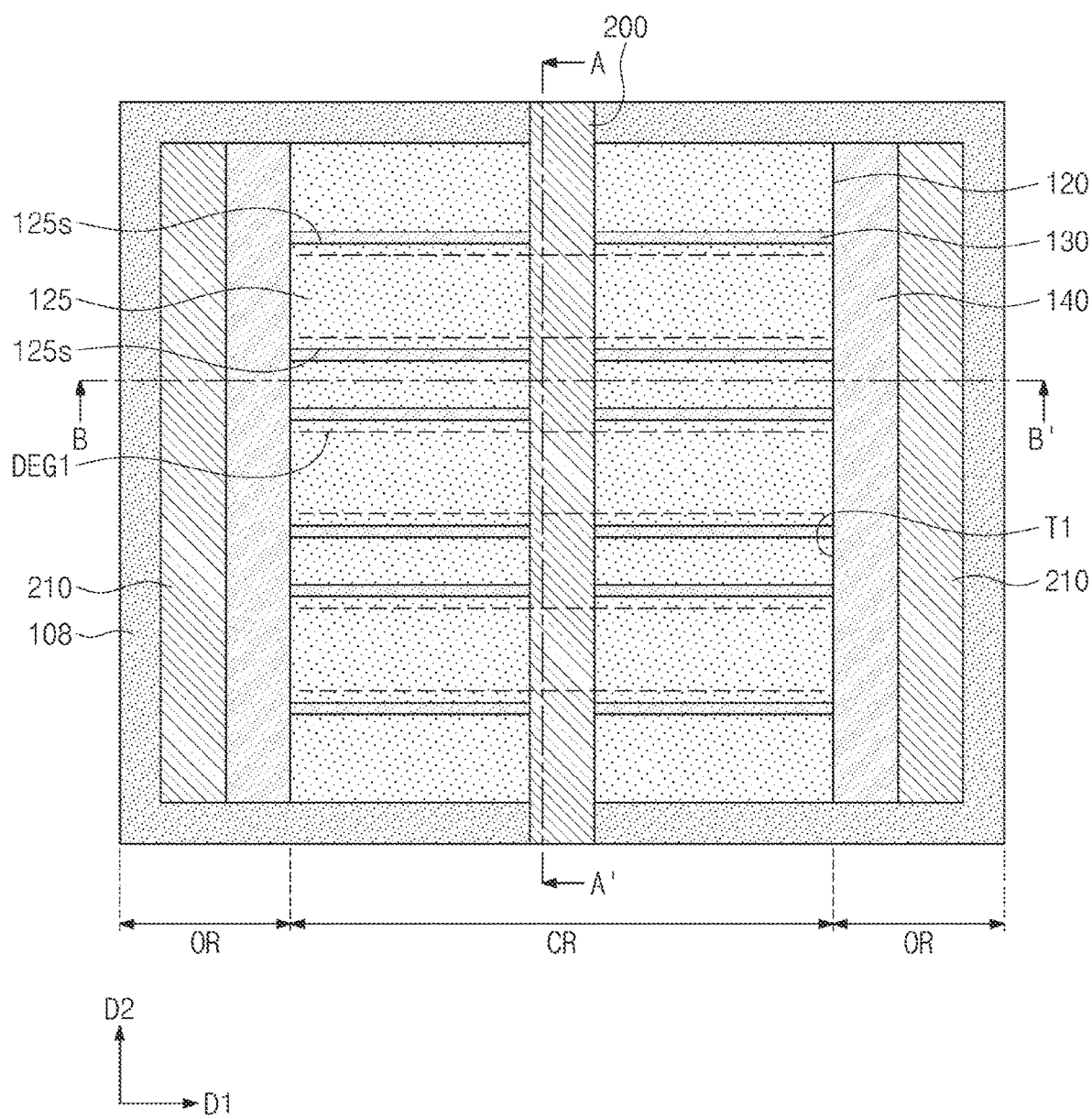
FIG. 1 is a plan view illustrating a compound semiconductor device according to embodiments of the inventive concept.

Embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the specification, the technical terms are used only for explaining a specific exemplary embodiment while not limiting the present invention. In the specification, the terms of a singular form may include plural forms unless referred to the contrary.

In the specification, the meaning of 'comprises' and/or 'comprising' specifies a component, a step, an operation and/or an element does not exclude other components, steps, operations and/or elements.

In the specification, the meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. Like reference numerals refer to like elements throughout.

Unless terms used in embodiments of the present invention are differently defined, the terms may be construed as meanings that are commonly known to a person skilled in the art.

Hereinafter, a compound semiconductor device according to embodiments of the inventive concept will be described with reference to the accompanying drawings.

Figure 2:
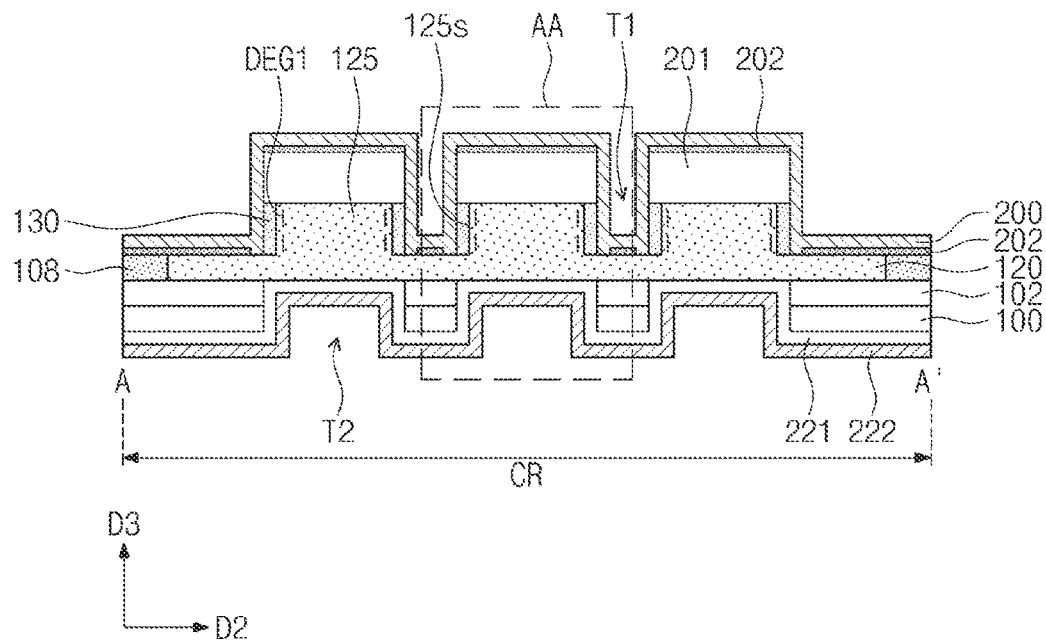
FIG. 2 is a cross-sectional view taken along the line A-A' of FIG. 1.
Figure 3:
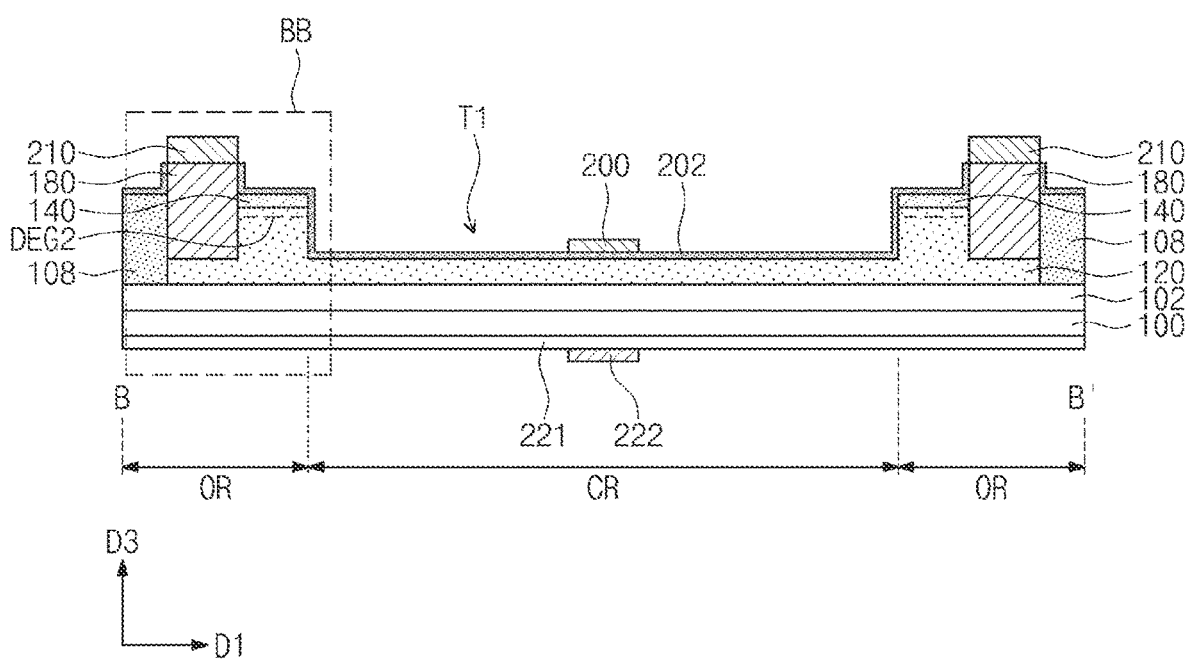
FIG. 3 is a cross-sectional view taken along the line B-B' of FIG. 1.
Figure 4A:
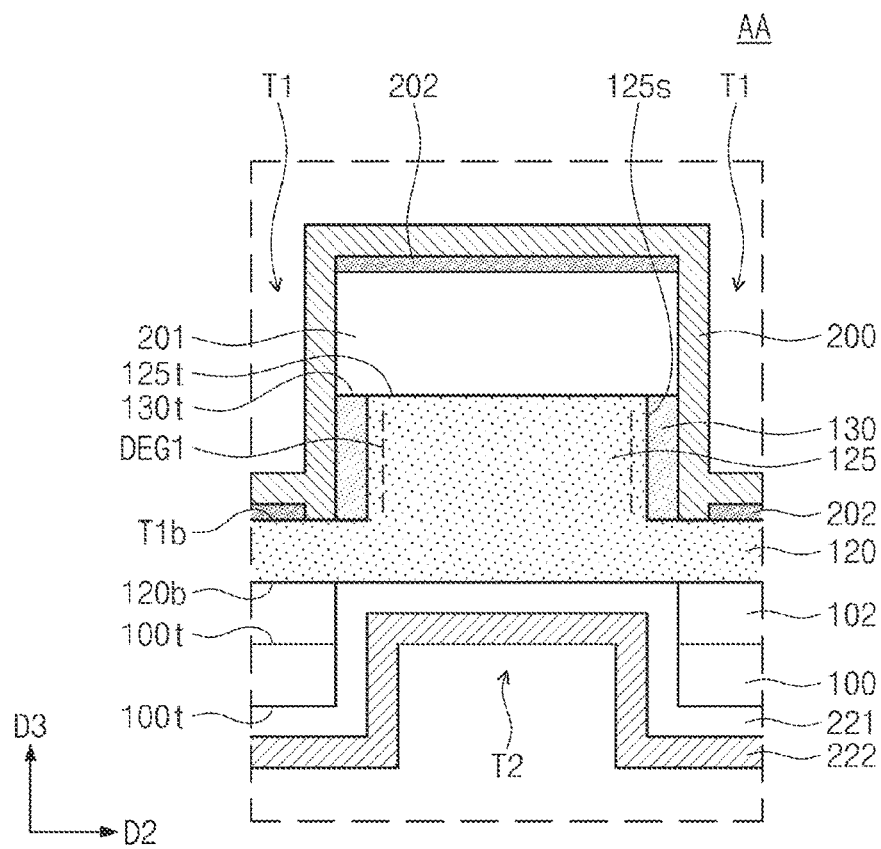
FIG. 4A is an enlarged view illustrating a portion A of FIG. 2.
Figure 4B:
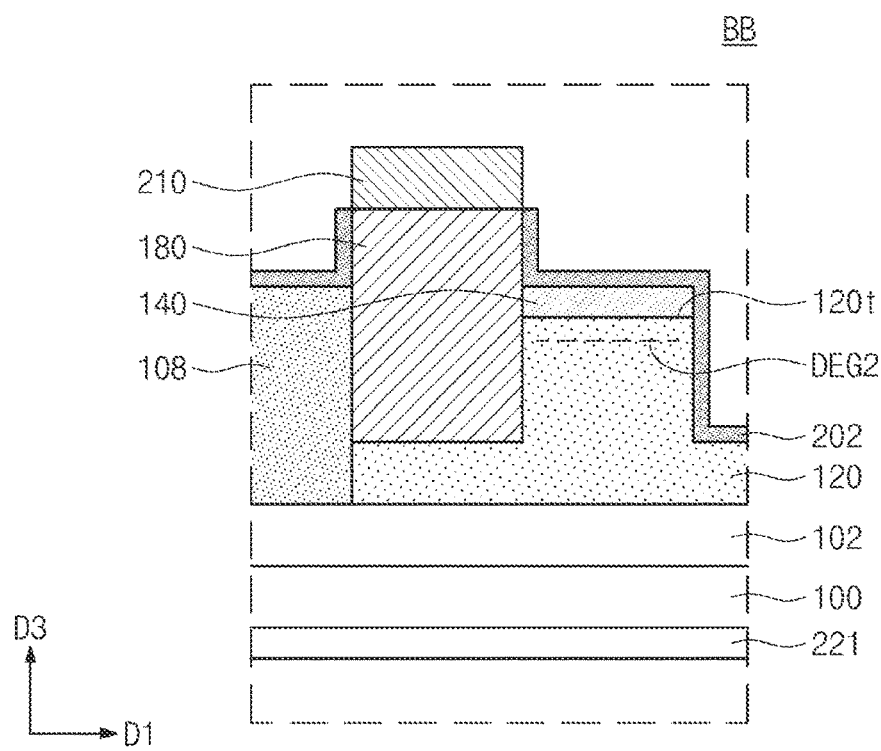
FIG. 4B is an enlarged view illustrating a portion B of FIG. 2.

FIG. 1 is a plan view illustrating a compound semiconductor device according to embodiments of the inventive concept. FIG. 2 is a cross-sectional view taken along the line A-A' of FIG. 1. FIG. 3 is a cross-sectional view taken along the line B-B' of FIG. 1. FIG. 4A is an enlarged view illustrating a portion A of FIG. 2. FIG. 4B is an enlarged view illustrating a portion B of FIG. 2.

Referring to FIGS. 1 to 3, a substrate 100 having a central region CR and outer regions OR may be provided. The outer regions OR may be spaced apart from each other in a first direction D1 parallel to a top surface of the substrate 100 with the central region CR therebetween. The central region CR may be a region in which a channel of the compound semiconductor device is provided, and the outer regions OR may be regions in which source and drain regions of the compound semiconductor device are provided. The central region CR and the outer regions OR may be defined by a first trenches T1 that will be described later. The substrate 100 may include one of a semiconductor substrate and an insulation substrate. For example, the substrate 100 may include one of a silicon substrate, a silicon carbide substrate, a gallium nitride substrate, a sapphire substrate and diamond substrate.

A transition layer 102 may be disposed on the substrate 100. The transition layer 102 may be provided on the entire top surface of the substrate 100. The transition layer 102 may be disposed between the top surface of the substrate 100 and a bottom surface of a first semiconductor layer 120. The transition layer 102 may relieve a difference between thermal expansion coefficients and lattice constants of the substrate 100 and the first semiconductor layer 120. The transition layer 102 may have a lattice constant value between that of the substrate 100 and that of the first semiconductor layer 120. For example, the transition layer 102 may include one of AlN, GaN, InN, AlGaN, InGaN, AlInN, and AlGaInN.

The first semiconductor layer 120 may be disposed on the transition layer 102. The first semiconductor layer 120 may include a doped semiconductor material or a non-doped semiconductor material. According to embodiments, the first semiconductor layer 120 may include a group III-V semiconductor compound. For example, the first semiconductor layer 120 may include one of AlN, InN, GaN, AlGaN, InGaN, AlInN, AlGaInN, and GaAs. The first semiconductor layer 120 may have fins 125 disposed on the substrate 100 of the central region CR. The fins 125 may each extend in the first direction D1 and cross the central region CR of the substrate 100. The fins 125 may be arranged in a second direction D2 perpendicular to the first direction D1. The fines 125 may be spaced apart from each other in the second direction D2. The fins 125 may be a portion of the first semiconductor layer 120 or disposed at an upper portion of the first semiconductor layer 120. According to embodiments, the first semiconductor layer 120 may have three fins 125 extending in parallel to each other.

According to embodiments, the number of the fins 125 may be adjusted according to an output characteristic required to the compound semiconductor device. For example, the compound semiconductor device may be a high electron mobility transistor (HEMT) device, and the number of the fins 125 may increase as an output power of the HEMT device is increased. According to embodiments, the first semiconductor layer 120 may have one fin 125.

Referring to FIGS. 1 to 4A, the fins 125 may be defined by first trenches T1 provided from a top surface to a bottom surface 120b of the first semiconductor layer 120. As illustrated in FIG. 1, the first trenches T1 may each extend in the first direction to define a width of the central region CR. The first trenches T1 may be arranged in the second direction D2. According to embodiments, each of the first trenches T1 may have a width in the second direction D2 less than that in the second direction D2 of each of the fins 125. According to embodiments, a bottom surface T1b of the first trench T1 may be disposed closer to a bottom surface 120b of the first semiconductor layer 120 than a top surface 125t of the fin 125. In other words, a depth of the first trench T1 (i.e., a height of the fin 125) may be greater than a half of a thickness of the first semiconductor layer 120.

The central region CR of the compound semiconductor device will be described with reference to FIGS. 1, 2, and 4A. A second semiconductor layer 130 may be disposed on the substrate 100 of the central region CR. The second semiconductor layer 130 may be disposed on a sidewall 125s of the first semiconductor layer 120. The second semiconductor layer 130 may be extended along the sidewall 125s of the fin 125 in the first direction D1. The second semiconductor layer 130 may have a width in the second direction D1 that is smaller than a height in the third direction D3. The second semiconductor layer 130 has a top surface 130t located at the same vertical level as a top surface of the first semiconductor layer 120 (i.e, the top surface 125t of the fin 125).

The second semiconductor layer 130 may include a material different from that of the first semiconductor layer 120. The second semiconductor layer 130 may have a lattice constant different from that of the first semiconductor layer 120. The second semiconductor layer 130 may have a bandgap different from that of the first semiconductor layer 120. For example, the second semiconductor layer 130 may have a bandgap wider than that of the first semiconductor layer 120. The second semiconductor layer 130 may include a material bonded to the first semiconductor layer 120 to provide a 2-dimensional electron gas region in the first semiconductor layer 120. The second semiconductor layer 130 may include a nitride semiconductor material containing at least one of Al, Ga, In, and B. For example, the second semiconductor layer 130 may include one of GaN, InN, AlGaN, AlInN, InGaN, AlN, and AlInGaN. According to embodiments, the second semiconductor layer 130 may include a plurality of semiconductor layers containing materials different from each other.

The second semiconductor layer 130 may directly contact the fins 125 of the first semiconductor layer 120. As the second semiconductor layer 130 and the first semiconductor layer 120, which include semiconductor materials different from each other, are bonded to each other, first 2-dimensional electron gas regions DEG1 may be provided in the first semiconductor layer 120. The first 2-dimensional electron gas regions DEG1 may be provided adjacent to an interface between the first semiconductor layer 120 and the second semiconductor layer 130. That is, the first 2-dimensional electron gas regions DEG1 may be provided adjacent to the sidewalls 125s of the fins 125. The first 2-dimensional electron gas regions DEG1 may extend along the fins 125 in the first direction D1. Each of the first 2-dimensional electron gas regions DEG1 may function as a channel for providing a movement path of electrons between source and drain electrodes 210. The first 2-dimensional electron gas region DEG1 may extend in a vertical direction (i.e., a third direction D3) along the sidewalls 125s of the fins 125.

The first 2-dimensional electron gas region DEG1 may not extend in the second direction D2. That is, the first 2-dimensional electron gas region DEG1 may be locally provided in a region adjacent to the sidewalls 125s of the fins 125. The first 2-dimensional electron gas region DEG1 provided in the region adjacent to sidewalls 125s may reduce a leakage current of the compound semiconductor device and easily control a frequency characteristic, a drain current, and a threshold voltage caused by a lower gate structure 221 and 222 that will be described later.

Dielectric layers 201 may be disposed on the first semiconductor layer 120 and the second semiconductor layer 130. The dielectric layers 201 may be disposed on the fins 125, respectively, and extend along the fins 125 in the first direction D1 (refer to FIG. 8A). The dielectric layer 201 may be disposed on a top surface 125t of the fin 125 and a top surface 130t of the second semiconductor layer 130. The dielectric layer 201 may have a width in the second direction D2, which is the same as a sum of a width in the second direction D2 of the fin 125 and a width of the second semiconductor layers 130 on two sidewalls 125s of the fin 125. The dielectric layer 201 may have a side surface aligned with a side surface of the second semiconductor layer 130 The dielectric layer 201 may have a thickness greater than that of an interface insulation layer 202. Also, the dielectric layer 201 may have a thickness greater than that of a lower gate insulation layer 221 that will be described later. The dielectric layer 201 may have a thickness in a range from about 20 nm to about 100 nm.

For example, the dielectric layer 201 may include one of a silicon oxide, a silicon nitride, and a silicon oxynitride. According to embodiments, the dielectric layer 201 may have a multilayer structure and include at least one layer containing a high dielectric material.

The interface insulation layer 202 may be provided on the dielectric layer 201 and the first semiconductor layer 120 in the central region CR. One portion of the interface insulation layer 202 may be disposed between a top surface of the dielectric layer 201 and the upper gate electrode 200. The one portion of the interface insulation layer 202 may completely cover the top surface of the dielectric layer 210. The other portion of the interface insulation layer 202 may be disposed on the bottom surface T1b of the first trench T1. The other portion of the interface insulation layer 202 may partially cover a surface of the first semiconductor layer 120. The interface insulation layer 202 may have a thickness less than that of the dielectric layer 201. The interface insulation layer 202 may be disposed between the second semiconductor layer 130 and the upper gate electrode 200 and between the dielectric layer 201 and the upper gate electrode 200. For example, the interface insulation layer 202 may include one of a silicon oxide, a silicon nitride, and a silicon oxynitride. The interface insulation layer 202 may have a thickness in a range from about 1 nm to about 5 nm.

The outer regions OR of the compound semiconductor device will be described with reference to FIGS. 1, 3, and 4B. A third semiconductor layer 140 may be disposed on the substrate 100 of the outer regions OR. The third semiconductor layer 140 may be disposed on a top surface 120t of the first semiconductor layer 120. The third semiconductor layer 140 may include a material different from that of the first semiconductor layer 120. The third semiconductor layer 140 may have a lattice constant different from that of the first semiconductor layer 120. The third semiconductor layer 140 may have a bandgap different from that of the first semiconductor layer 120. For example, the third semiconductor layer 140 may have a bandgap wider than that of the first semiconductor layer 120. The third semiconductor layer 140 may include a material bonded to the first semiconductor layer 120 to provide the 2-dimensional electron gas region in the first semiconductor layer 120 According to embodiments, the third semiconductor layer 140 may include a nitride semiconductor material containing at least one of Al, Ga, In, and B. According to embodiments, the third semiconductor layer 140 may include a plurality of semiconductor layers containing materials different from each other. According to embodiments, the third semiconductor layer 140 may include the same material as the second semiconductor layer 130 on the central region CR.

Source and drain contacts 180 may be disposed on the first semiconductor layer 120. The source and drain contacts 180 may extend into the first semiconductor layer 120 and be disposed adjacent to a second 2-dimensional electron gas region DEG2. Each of the source and drain contacts 180 may have a bottom surface disposed at a level lower than that of the top surface 120*t* of the first semiconductor layer 120. The source and drain contacts 180 may include metal or a doped semiconductor material. For example, the source and drain contacts 180 may ohmic-contact the first semiconductor layer 120.

The interface insulation layer 202 may cover the third semiconductor layer 140 and upper sidewalls of the source and drain contacts 180.

The source and drain electrode 210 may be disposed on the source and drain contact 180. The source and drain electrode 210 may contain metal. For example, the source and drain electrode 210 may include one of copper (Cu), aluminum (Al), gold (Au), and nickel (Ni).

Referring to FIGS. 1 to 4B again, a separation region 108 may be provided at an edge of each of the central region CR and the outer regions OR. The separation region 108 may have a closed curve shape surrounding the central region CR. The separation region 108 may include a semiconductor material having a high dopant concentration. According to embodiments, the separation region 108 may include an impurity. For example, the separation region 108 may include phosphorus (P) or argon (Ar). The separation region 108 may electrically isolate the compound semiconductor device from other regions of the substrate 100. The separation region 108 may be provided from one portions of the first semiconductor layer 120, the second semiconductor layer 130, and the third semiconductor layer 140. The separation region 108 may have electrical conductivity less than that of each of the first semiconductor layer 120, the second semiconductor layer 130, and the third semiconductor layer 140.

The lower gate structure 221 and 222 may be disposed on a bottom surface of the substrate 100. The lower gate structure 221 and 222 may be connected to the bottom surface 120*b* of the first semiconductor layer 120 by passing through the substrate 100 and the transition layer 102. The lower gate structure 221 and 222 may extend in the second direction D2 and vertically overlap the upper gate electrode 200. The lower gate structure 221 and 222 may fill at least a portion of second trenches T2 exposing the bottom surface 120*b* of the first semiconductor layer 120. The second trenches T2 may overlap the fins 125.

The lower gate structure 221 and 222 may include a lower gate insulation layer 221 and a lower gate electrode 222. The lower gate insulation layer 221 may conformally cover the bottom surface of the substrate and inner surfaces of the second trench T2. The lower gate insulation layer 221 may contact the bottom surface 120*b* of the first semiconductor layer 120. Also, the lower gate insulation layer 221 may have a thickness less than that of the dielectric layer 201. For example, the lower gate insulation layer 221 may include one of a silicon oxide, a silicon nitride, and a silicon oxynitride.

The lower gate electrode 222 may be disposed on a bottom surface of the lower gate insulation layer 221. The lower gate electrode 222 may extend in the second direction D2. As illustrated in FIG. 3, the lower gate electrode 222 may vertically overlap the upper gate electrode 200. The lower gate electrode 222 may include metal or a doped semiconductor material.

The lower gate electrode 222 may modulate a threshold voltage, a drain current, or an output-frequency characteristic of the compound semiconductor device by applying a voltage to the semiconductor layers on the substrate 100. Specifically, the upper gate electrode 200 and the lower gate electrode 222 may be individually controlled to control a potential in the semiconductor layers of the compound semiconductor device. A potential generated by a voltage applied to the lower gate electrode 222 may overlap a potential generated by a voltage applied to the upper gate electrode 200. The compound semiconductor device according to embodiments of the inventive concept may have a performance varied according to an operation state thereof. For example, when a system is in a stand-by state, a power consumption amount may be decreased by reducing a leakage current. For example, when the system is in a high output operation state, an output of the system may be increased by increasing a drain current.

Hereinafter, the compound semiconductor device according to embodiments of the inventive concept will be described with reference to the accompanying drawings.

FIGS. 5A, 6A, 7A, 8A, 9A, and 10A are plan views for explaining a method for manufacturing a compound semiconductor device according to embodiments of the inventive concept. FIGS. 5B, 6B, 7B, 8B, 9B, and 10B are cross-sectional views respectively taken along lines A-A' of FIGS. 5A, 6A, 7A, 8A, 9A, and 10A. FIGS. 5C, 6C, 7C, 8C, 9C, and 10C are cross-sectional views respectively taken along lines B-B' of FIGS. 5A, 6A, 7A, 8A, 9A, and 10A.

Figure 5A:
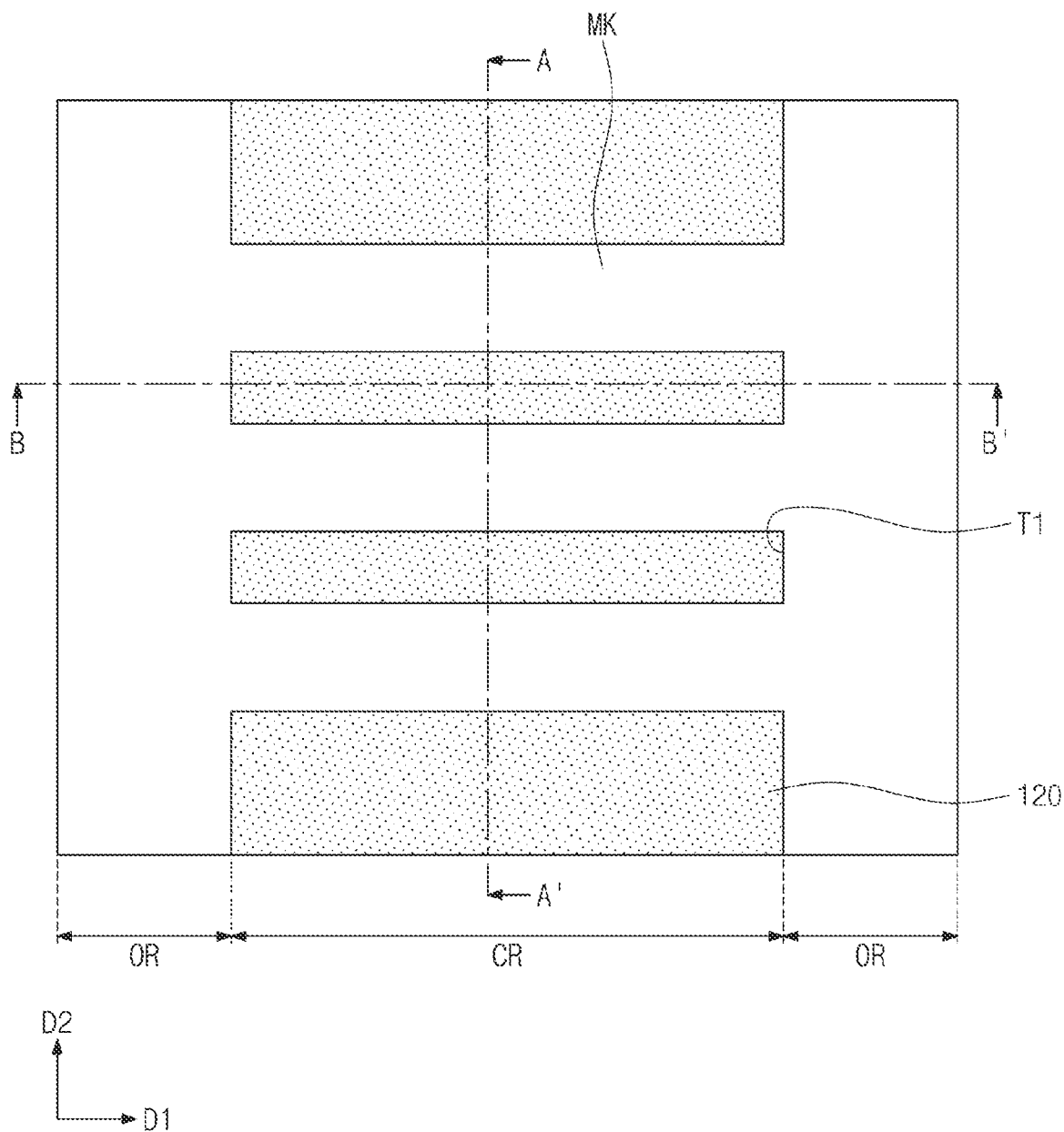
Figure 5B:
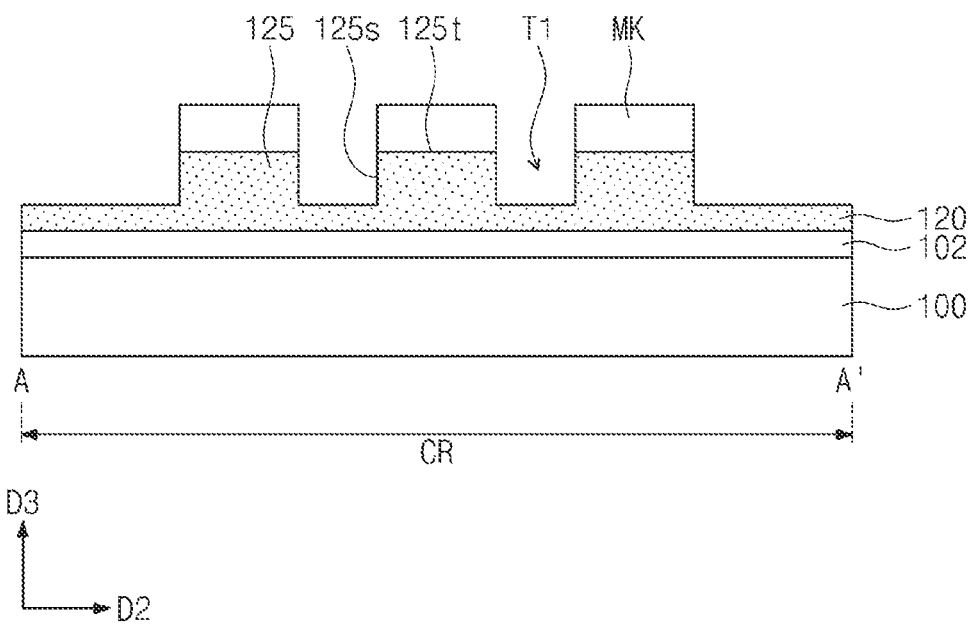
Figure 5C:
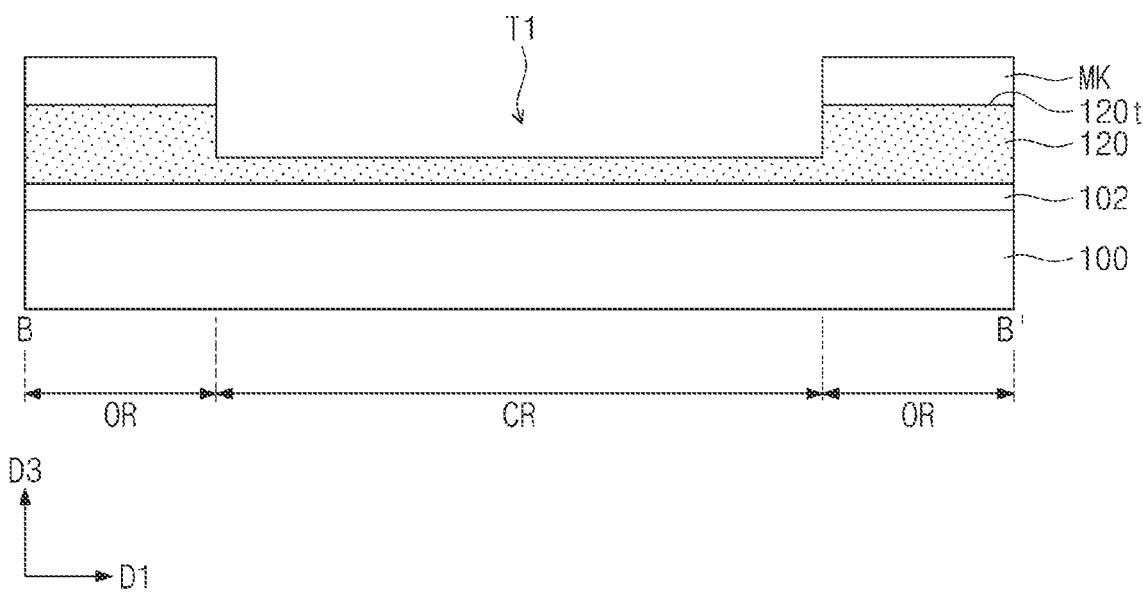
FIGS. 5C, 6C, 7C, 8C, 9C, and 10C are cross-sectional views respectively taken along lines B-B' of FIGS. 5A, 6A, 7A, 8A, 9A, and 10A, and FIGS. 11A and 11B are cross-sectional views showing a lower gate structure formed on a bottom surface of a substrate.

Referring to FIGS. 5A to 5C, a transition layer 102 and a first semiconductor layer 120 may be sequentially laminated on a substrate 100. The transition layer 102 and the first semiconductor layer 120 may be formed by using metalorganic chemical vapor deposition (MOCVD) or molecular beam epitaxy (MBE).

Fins 125 may be formed on a central region CR of the substrate 100 by pattering the first semiconductor layer 120. The patterning of the first semiconductor layer 120 may include forming a mask pattern MK1 on the first semiconductor layer 120 and performing an etching process by using the mask pattern MK1 as an etching mask. The mask pattern MK1 may cover the entire first semiconductor layer 120 on an outer region OR of the substrate 100. The mask pattern MK1 may partially expose the first semiconductor layer 120 on the central region CR of the substrate 100. As the etching process is performed, first trenches T1 may be formed in an upper portion of the first semiconductor layer 120. The trenches T1 may each extend in the first direction and be arranged in the second direction D2. A fin 125 may be defined between two adjacent first trenches T1.

While the etching process is performed, top surfaces 125*t* of the fins 125 disposed on the central region CR and a top surface 120*t* of the first semiconductor layer 120 disposed on the outer region OR may be covered by the mask pattern MK1. Thus, the top surfaces 125*t* of the fins 125 may be disposed at the same level as the top surface 120*t* of the first semiconductor layer 120. The mask pattern MK1 may be removed after the etching process is performed.

Figure 6A:
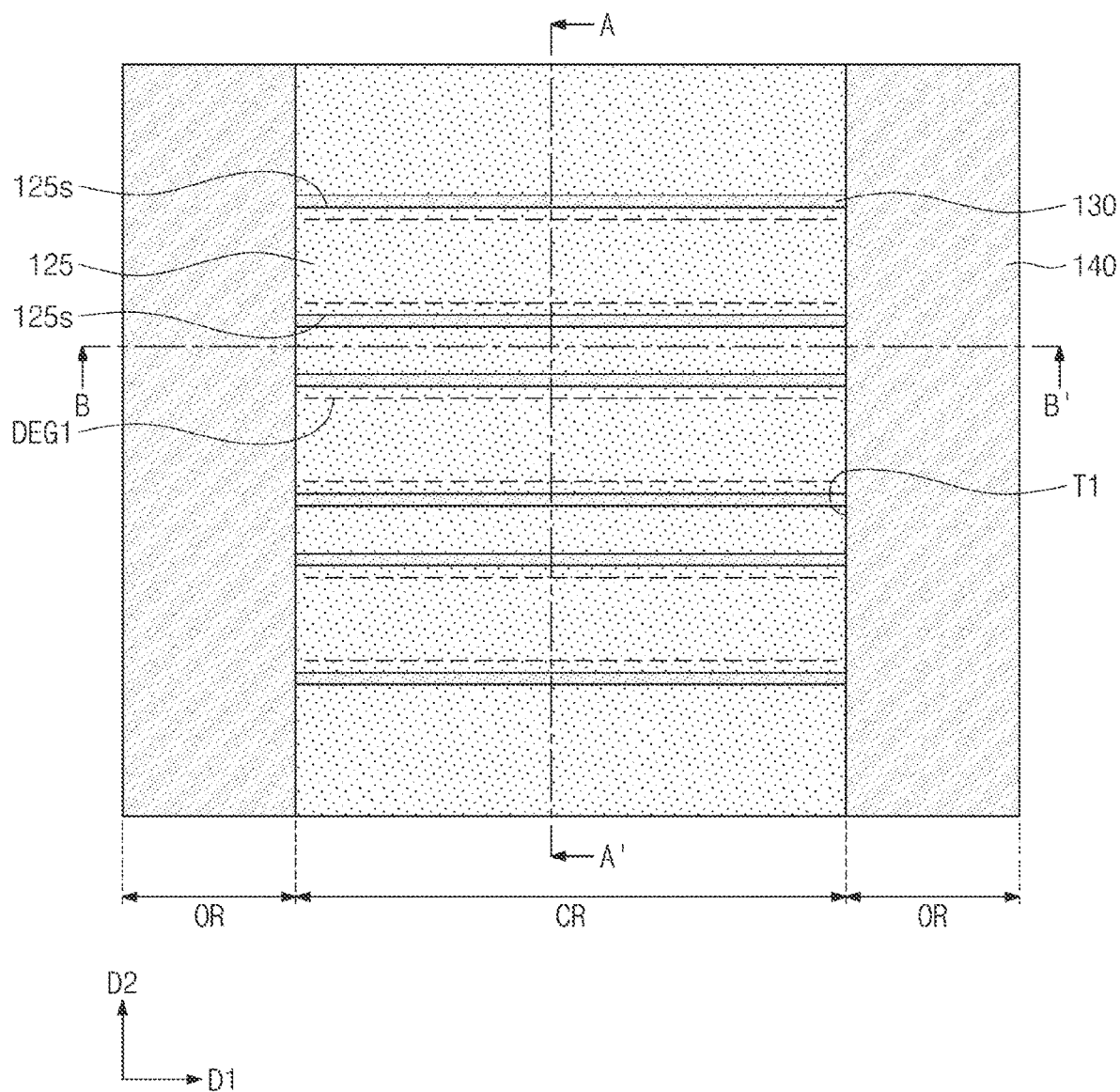
Figure 6B:
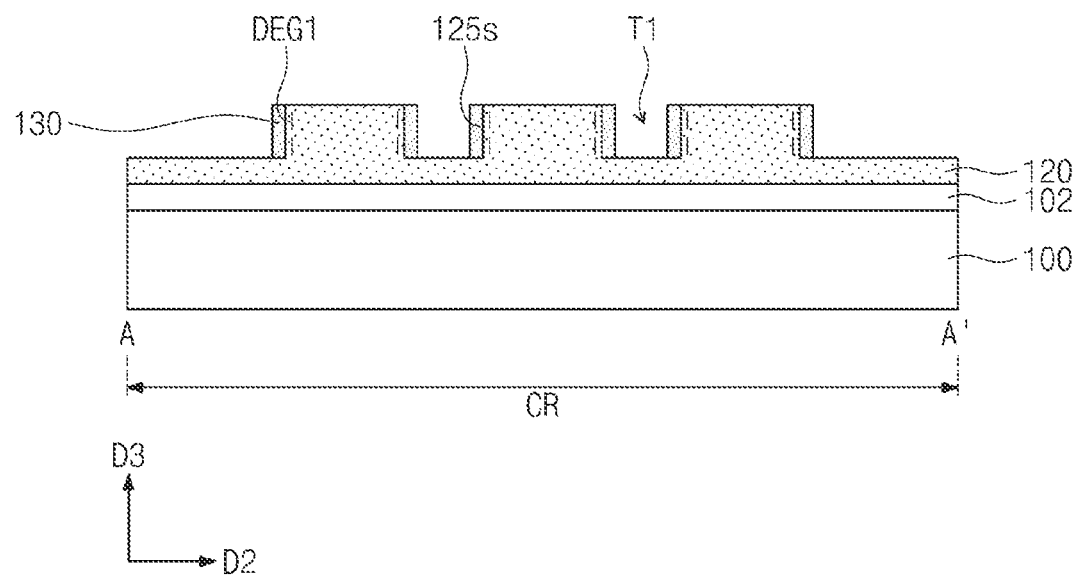
Figure 6C:
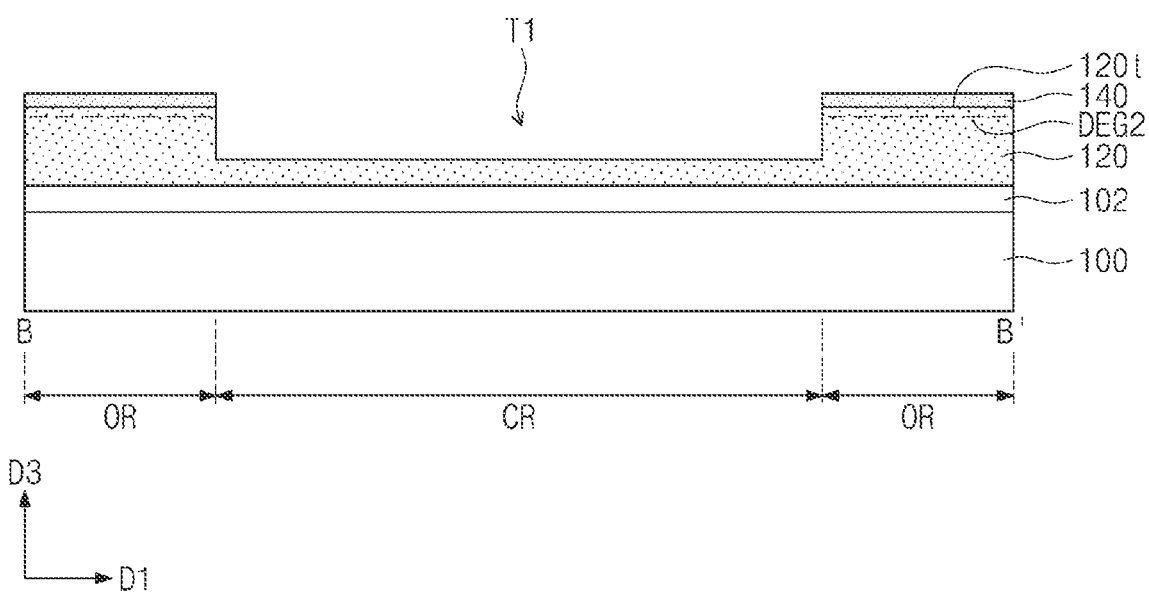

Referring to FIGS. 6A to 6C, a second semiconductor layer 130 may be formed on the central region CR of the substrate 100, and a third semiconductor layer 140 may be formed on the outer region OR of the substrate 100. According to embodiments, the forming of the second semiconductor layer 130 and the third semiconductor layer 140 may include forming a preliminary semiconductor layer on the first semiconductor layer 120, which includes a material different from that of the first semiconductor layer 120, and patterning the preliminary semiconductor layer. According to embodiments, the forming of the second semiconductor layer 130 and the third semiconductor layer 140 may include forming a sacrificial pattern on the first semiconductor layer 120 and then performing a deposition process on a surface of the first semiconductor layer 120, which is exposed by the sacrificial pattern. The second semiconductor layer 130 may be formed on a sidewall 125s of the fins 125 of the first semiconductor layer 120. The third semiconductor layer 140 may be formed on the top surface 120t of the first semiconductor layer 120 disposed on the outer region OR.

The first semiconductor layer 130 may be heterojunctioned with the second semiconductor layer 130 and the third semiconductor layer 140 to form a 2-dimensional electron gas region. The 2-dimensional electron gas region may be formed in the first semiconductor layer 120 by spontaneous polarization or piezo-polarization. Specifically, first 2-dimensional electron gas regions DEG1 may be formed in a region adjacent to the sidewall 125s of the fins 125 by lattice mismatch of the first semiconductor layer 120 and the second semiconductor layer 130. Second 2-dimensional electron gas regions DEG2 may be formed in a region adjacent to the top surface 120t of the first semiconductor layer 120 disposed on the outer regions OR by lattice mismatch of the first semiconductor layer 120 and the third semiconductor layer 140.

Figure 7B:
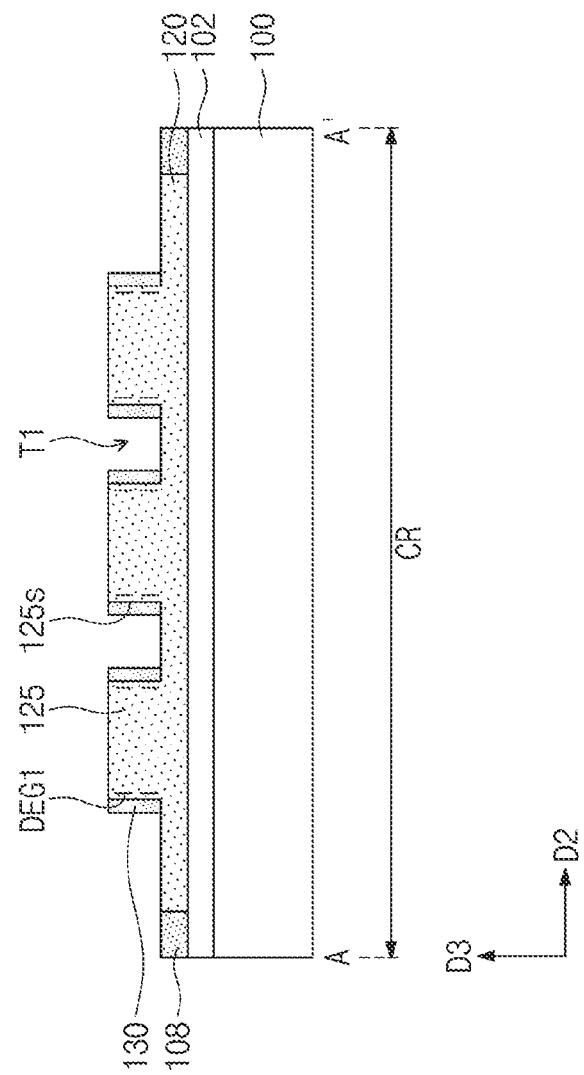
Figure 7C:
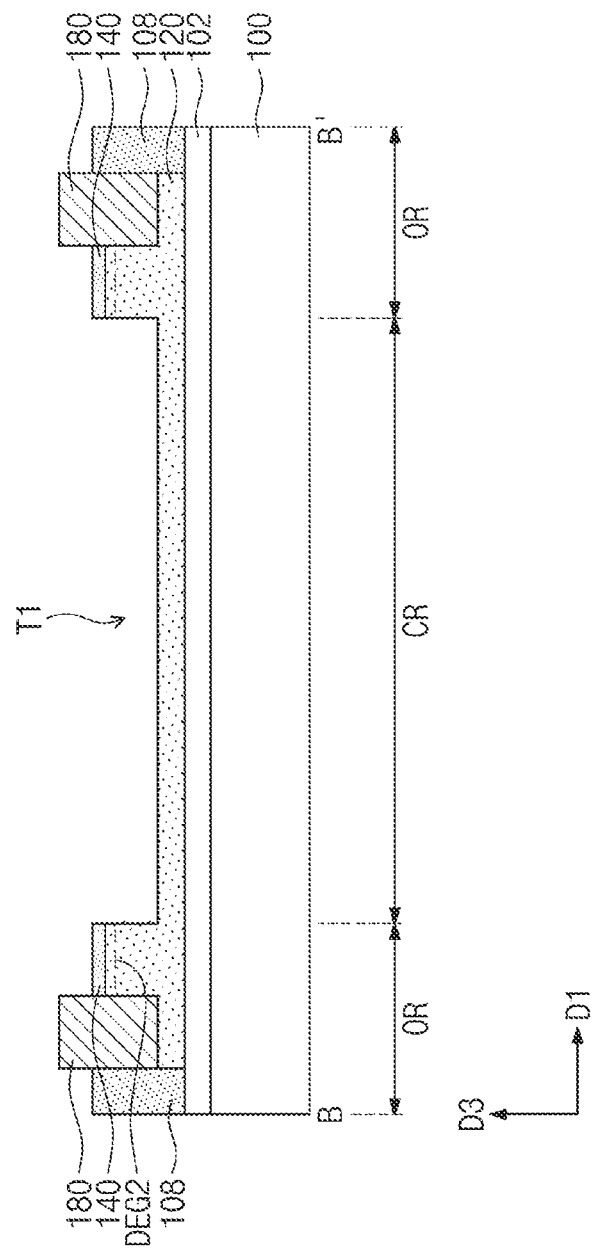

Referring to FIGS. 7A to 7C, source and drain contacts 180 may be formed on the outer regions OR. The forming of the source and drain contacts 180 may include forming a metal pattern on the third semiconductor layer 140 and diffusing the metal pattern into the first semiconductor layer 120. The metal pattern may be diffused into the first semiconductor layer 120 by a rapid thermal process. For example, the rapid thermal process may be performed in a temperature range from about 700° C. to about 1000° C. Before the rapid thermal process is performed, a protection layer covering the first semiconductor layer 120, the second semiconductor layer 130, the third semiconductor layer 140, and the metal pattern may be formed. The protection layer may include one of a silicon oxide and a silicon nitride. The protection layer may be removed after the rapid thermal process is performed. According to embodiments, the forming of the source and drain contacts 180 may include forming a trench on the first semiconductor layer 120 and the second semiconductor layer 130 and forming the metal pattern for filling the trench.

Thereafter, a separation region 108 may be formed on an edge of each of the central region CR and the outer regions OR. The forming of the separation region 108 may include forming a mask pattern for exposing an edge of the substrate 100 and then performing an ion implantation process. For example, the ion implantation process may be performed by using phosphorus (P) or argon (Ar). The separation region 108 may be formed from one portions of the first semiconductor layer 120, the second semiconductor layer 130, and the third semiconductor layer 140. The separation region 108 may have an impurity concentration greater than that of each of the first semiconductor layer 120, the second semiconductor layer 130, and the third semiconductor layer 140.

Figure 8B:
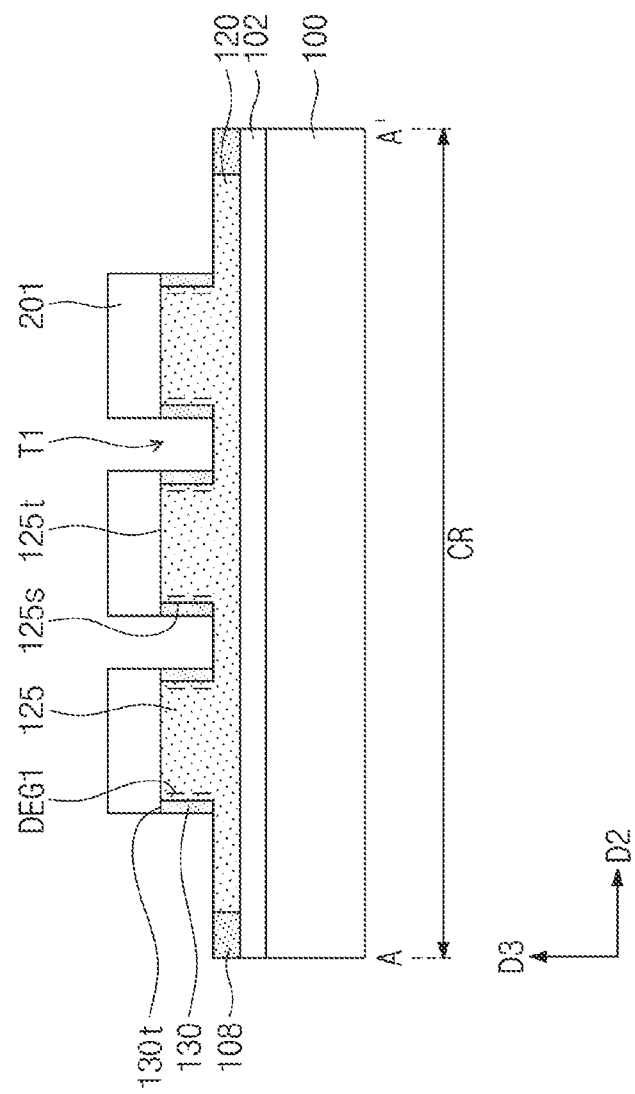
Figure 8C:
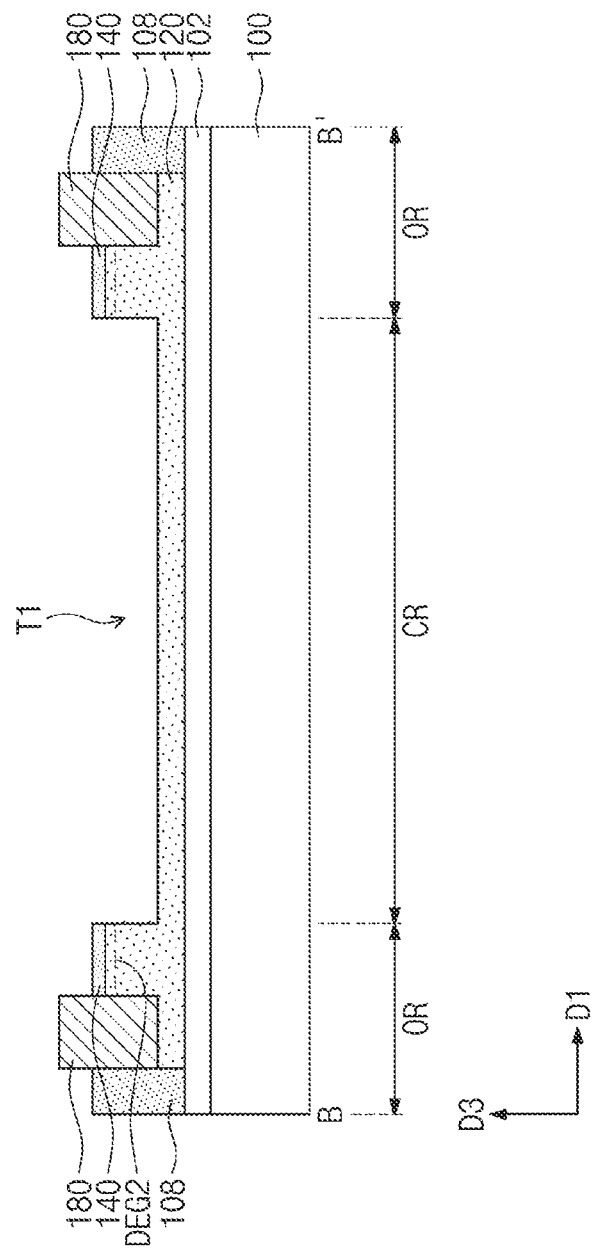

Referring to FIGS. 8A to 8C, a dielectric layer 201 may be formed on the top surfaces 125t of the fins 125. For example, the dielectric layer 201 may be formed by a chemical vapor deposition (CVD) process, a physical vapor deposition (PVD) process, or an atomic layer deposition (ALD) process. The dielectric layer 201 may cover the top surfaces 125t of the fins 125 and top surfaces 130t of the second semiconductor layer 130. The dielectric layer 201 may extend along the fins 125 in the first direction D1.

Figure 9B:
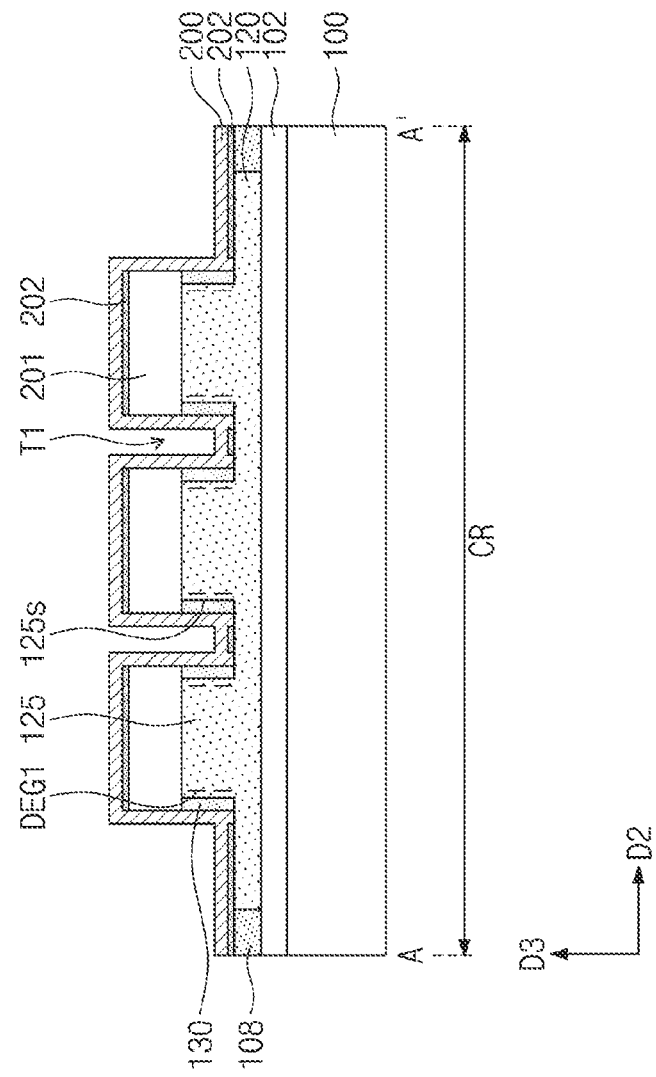
Figure 9C:
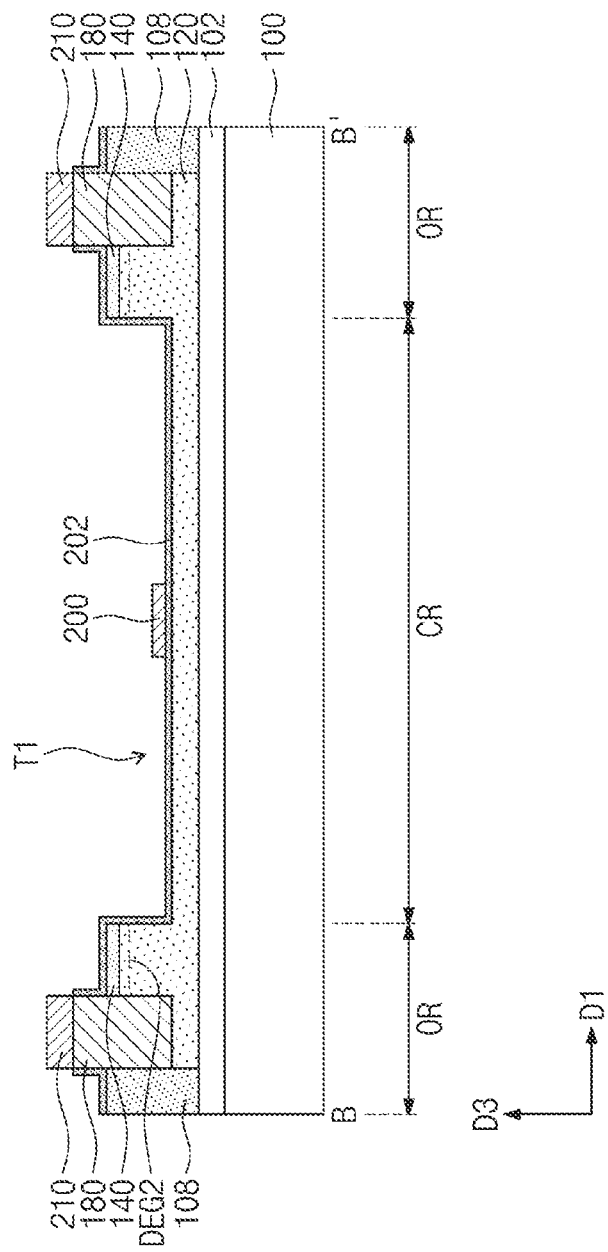

Referring to FIGS. 9A to 9C, an upper gate electrode 200 may be formed. For example, the upper gate electrode 200 may be formed by a metal evaporation process or a sputtering process. The upper gate electrode 200 may extend in the second direction D2 and conformally cover surfaces of the first semiconductor layer 120, the second semiconductor layer 130, and the dielectric layer 201.

Before the upper gate electrode 200 is formed, an interface insulation layer 202 may be formed. One portion of the interface insulation layer 202 may be formed between a top surface of the dielectric layer 201 and the upper gate electrode 200 to completely cover the top surface of the dielectric layer 201. The other portion of the interface insulation layer 202 may cover surfaces of the first semiconductor layer 120 and surfaces of the third semiconductor layer 140. The interface insulation layer 202 may be spaced apart from the second semiconductor layer 130.

Figure 10C:
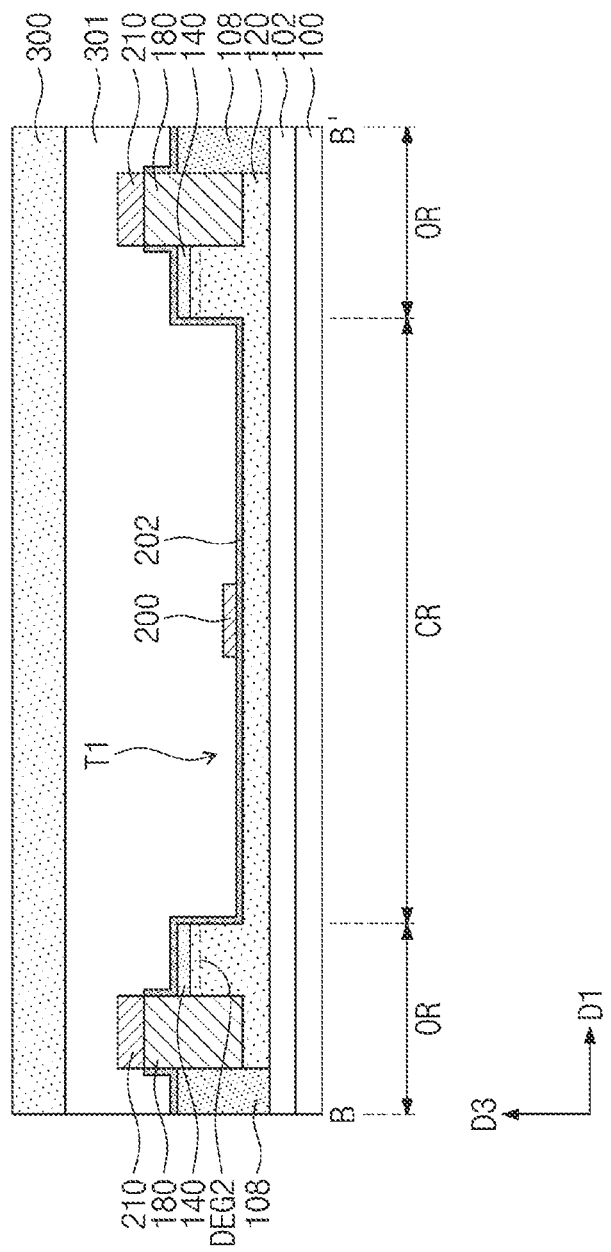

Referring to FIGS. 10A to 10C, an adhesive layer 301 and a carrier substrate 300 may be formed on a top surface of the substrate 100. The adhesive layer 301 may cover components formed on the top surface of the substrate 100. For example, the adhesive layer 301 may include benzocyclobutene (BCB) or heat resistant wax. For example, the carrier substrate 300 may include one of silicon (Si), silicon carbide (SiC), gallium nitride (GaN), sapphire, diamond, and aluminum nitride (AlN).

Thereafter, second trenches T2 may be formed by performing a patterning process on a bottom surface 100b of the substrate 100. The second trenches T2 may expose a bottom surface 120b of the first semiconductor layer 120 by passing through the substrate 100 and the transition layer 102. The second trenches T2 may vertically overlap the fins 125. Although not shown, the second trenches T2 may each extend in the first direction D1.

Figure 11A:
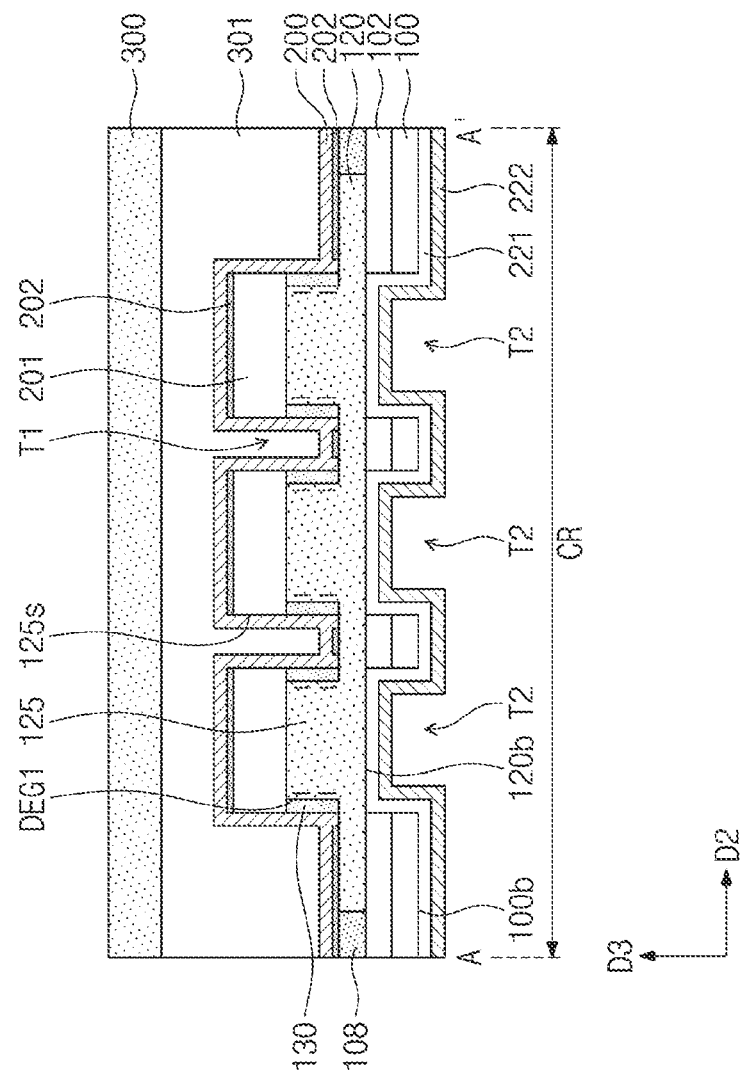
Figure 11B:
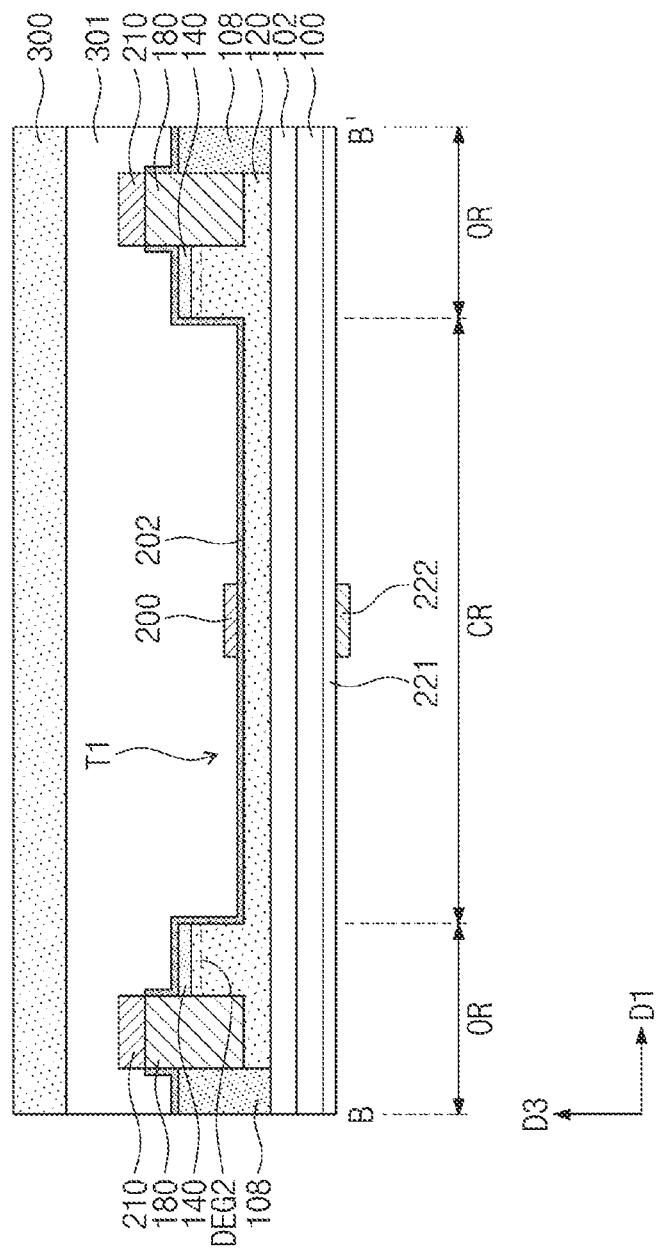

Referring to FIGS. 11A and 11B, a lower gate structure 221 and 222 may be formed on the bottom surface 100b of the substrate 100. The lower gate structure 221 and 222 may be connected to the bottom surface 120b of the first semiconductor layer 120 by passing through the substrate 100 and the transition layer 102. The lower gate structure 221 and 222 may fill at least a portion of the second trenches T2. The forming of the lower gate structure 221 and 222 may include forming a lower gate insulation layer 221 on the bottom surface 100b of the substrate 100 in a conformal manner and forming a lower gate electrode 222 on a bottom surface of the lower gate insulation layer 221. The lower gate insulation layer 221 may be formed on the entire bottom surface 100b of the substrate 100. The lower gate electrode 222 may extend in the second direction D2 and vertically overlap the upper gate electrode 200.

Referring to FIGS. 1 to 3 again, the compound semiconductor device may be manufactured by removing the adhesive layer 301 and the carrier substrate 300.

According to the embodiments of the inventive concept, the compound semiconductor device capable of decreasing the leakage current and easily controlling the performance may be provided.

The compound semiconductor device according to the embodiments of the inventive concept may modulate the electron mobility and the concentration of the 2-dimensional electron gas region in the channel by including the upper gate electrode and the lower gate electrode, which are individually controlled.

The first semiconductor layer of the compound semiconductor device according to the embodiments of the inventive concept may have the fin structure. As the second semiconductor layer is heterojunctioned onto the sidewall of the fin structure, the 2-dimensional electron gas region may be provided adjacent to the sidewall of the fin structure. Thus, the potential in the first semiconductor layer may be easily controlled by the lower gate electrode.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A compound semiconductor device comprising:
a first semiconductor layer having a fin extending in a first direction on a substrate;
an upper gate electrode extending in a second direction perpendicular to the first direction on the first semiconductor layer;
a second semiconductor layer disposed between a sidewall of the fin and the upper gate electrode;
a dielectric layer disposed between a top surface of the fin and the upper gate electrode; and
a lower gate structure connected to a bottom surface of the first semiconductor layer by passing through the substrate;
wherein the upper gate electrode has a lower end disposed closer to the bottom surface of the first semiconductor layer than the top surface of the fin.

2. The compound semiconductor device of claim 1, wherein the second semiconductor layer extends along the sidewall of the fin in the first direction.

3. The compound semiconductor device of claim 1, wherein a width in the second direction of the second semiconductor layer is less than a height of the second semiconductor layer.

4. The compound semiconductor device of claim 1, wherein the second semiconductor layer has a top surface disposed at a same vertical level as a top surface of the fin.

5. The compound semiconductor device of claim 1, wherein the second semiconductor layer has a bandgap different from a bandgap of the first semiconductor layer.

6. The compound semiconductor device of claim 1, wherein the dielectric layer covers a top surface of the second semiconductor layer.

7. The compound semiconductor device of claim 1, further comprising source and drain contacts spaced apart from each other in the first direction and connected to the first semiconductor layer,
wherein the upper gate electrode is disposed between the source and drain contacts.

8. The compound semiconductor device of claim 1, wherein the lower gate structure extends in the second direction.

9. The compound semiconductor device of claim 1, wherein the lower gate structure vertically overlaps the upper gate electrode.

10. A compound semiconductor device comprising:
a first semiconductor layer having a fin extending in a first direction on a substrate;
an upper gate electrode extending in a second direction perpendicular to the first direction on the first semiconductor layer;
a second semiconductor layer disposed between a sidewall of the fin and the upper gate electrode;
a dielectric layer disposed between a top surface of the fin and the upper gate electrode;
a lower gate structure connected to a bottom surface of the first semiconductor layer by passing through the substrate; and
an interface insulation layer disposed between a top surface of the dielectric layer and the gate electrode,
wherein the interface insulation layer has a thickness less than a thickness of the dielectric layer.

11. The compound semiconductor device of claim 1, wherein the upper gate electrode directly contacts the second semiconductor layer.

12. The compound semiconductor device of claim 1, wherein the dielectric layer has a thickness in a range from about 20 nm to about 100 nm.

13. A compound semiconductor device comprising:
a first semiconductor layer having a fin extending in a first direction on a substrate;
an upper gate electrode extending in a second direction perpendicular to the first direction on the first semiconductor layer;
second semiconductor layers disposed between sidewalls of the fin and the upper gate electrode; and
a dielectric layer disposed on a top surface of the fin and top surfaces of the second semiconductor layers,
wherein the second semiconductor layers are spaced apart from each other in the second direction and extend in parallel to each other in the first direction;
wherein the upper gate electrode directly contacts the second semiconductor layers.

14. The compound semiconductor device of claim 13, wherein the second semiconductor layers have top surfaces disposed at a same vertical level as a top surface of the first semiconductor layer.

15. The compound semiconductor device of claim 13, wherein each of the second semiconductor layers has a bandgap different from a bandgap of the first semiconductor layer.

16. The compound semiconductor device of claim 13, further comprising a lower gate structure connected to a bottom surface of the first semiconductor layer by passing through the substrate,
wherein the lower gate structure extends in the second direction.

17. The compound semiconductor device of claim 13, further comprising an interface insulation layer disposed between a top surface of the dielectric layer and the gate electrode,
wherein the interface insulation layer has a thickness less than a thickness of the dielectric layer.

18. The compound semiconductor device of claim 13, further comprising source and drain contacts spaced apart from each other in the first direction and connected to the first semiconductor layer,
wherein the upper gate electrode is disposed between the source and drain contacts.

* * * * *